United States Patent

Hansen

[11] 3,967,204
[45] June 29, 1976

[54] CIRCUIT FOR STORING THE AMPLITUDE OF THE LOWER-FREQUENCY PORTION OF A COMPOSITE SIGNAL

[75] Inventor: Jens Hansen, Hildesheim, Germany

[73] Assignee: Blaupunkt-Werke GmbH, Hildesheim, Germany

[22] Filed: June 23, 1975

[21] Appl. No.: 589,184

[30] Foreign Application Priority Data
June 10, 1974 Germany.........................2427878

[52] U.S. Cl............................. 325/473; 179/1 G; 325/477
[51] Int. Cl.² ......................................... H04B 1/10
[58] Field of Search................... 325/473, 474, 477; 179/1 G, 1 GQ, 15 BT

[56] References Cited
UNITED STATES PATENTS

| | | | |
|---|---|---|---|
| 2,802,932 | 8/1957 | Klehfoth | 325/477 X |
| 3,231,823 | 1/1966 | Garfield | 325/473 X |
| 3,241,073 | 3/1966 | Hummel | 325/473 |

Primary Examiner—David L. Stewart
Attorney, Agent, or Firm—William R. Woodward

[57] ABSTRACT

RC low-pass and high-pass filters are fed in common with a demodulated broadcast signal through a noise blanking switch device and the outputs of the respective filters are added in a summing amplifier, of which the output is supplied to the low-frequency stages of the receiver. For stereo reception, the crossover between the filters is made lower than the lowest pilot frequency of the composite demodulated signal, so that the circuit functions as an all-pass filter in the absence of disturbances and stores only the audible frequency program signal for transmission to the low-frequency stages during blanking intervals. For purely monophonic receivers, the passbands of the two filters may be spaced apart in frequency so as to provide a dip in the sum characteristic in the transition region contributing high-frequency de-emphasis to the audible signal, while still allowing transmission of an inaudible pilot signal or other superposed demodulated signal above the audible range when there is no interference blanking taking place.

5 Claims, 1 Drawing Figure

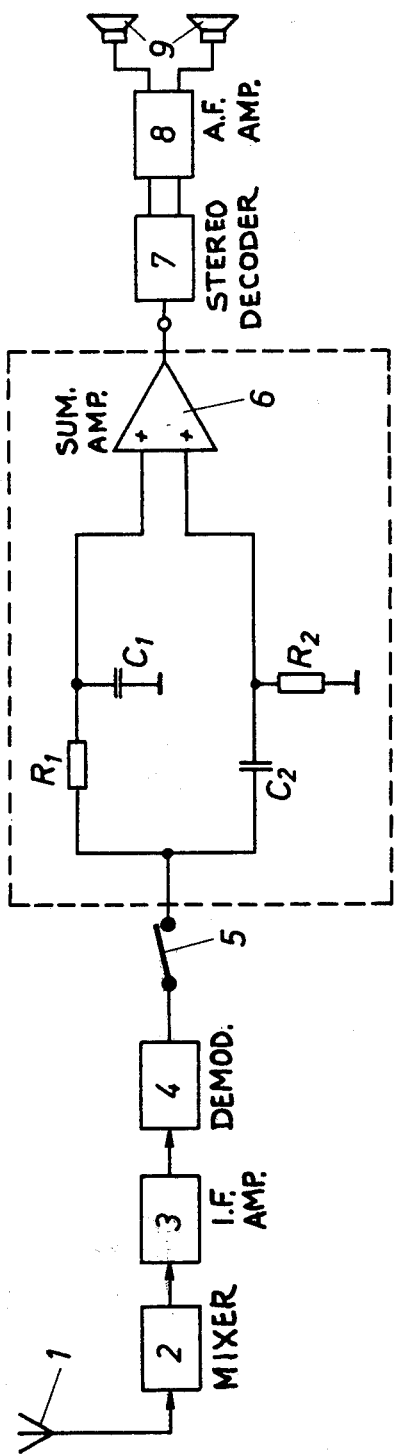

CIRCUIT FOR STORING THE AMPLITUDE OF THE LOWER-FREQUENCY PORTION OF A COMPOSITE SIGNAL

The invention relates to a circuit for storing an amplitude value of the demodulated signal of a radio receiver furnished by a demodulator circuit through an interruptor switch device during short intervals in which the switch device is open and a stored signal is required to provide continuity to the received signal. In particular, the invention relates to such a circuit for radio reception where the demodulated signal band is rather broad and the higher frequency portion thereof need not contribute to the stored signal and actually may contain frequencies of a period comparable to at least some of the interruption periods produced by the interruptor switch device (which may be a noise blanker circuit).

Circuits for storing a signal amplitude value and providing that value to a radio receiver output during interruption of a demodulator signal by a noise blanking device, or the like, are known. They serve to prevent any audible switched-off gaps or switching transients from being produced by supplying the low-frequency amplifier of the receiver with the more or less momentary value of the signal amplitude that existed before the disturbance, so as to bridge the interval during which the signal is blanked.

A problem is found in this signal storage process because following the demodulator there are frequently not only the audible signals, but also supplementary signals of various types. These supplementary signals are in a frequency region above that of the audible frequencies. Thus, for example, in the case of stereo broadcasts, a stereo pilot tone of 19 kHz and also the sidebands spread out on both sides of 38 kHz and carrying the right - left signal necessary for the directional information are also found in the demodulated signal. In addition, for traffic or commercial purposes, an additional pilot signal of 57 kHz is sometimes also provided in the broadcast modulation and appears in the demodulated signal.

In the known circuits for bridging the blanking intervals, the momentary values of these supplementary signals are stored along with the audible signal. Since the amplitudes of the supplementary signals are superimposed on the amplitude of the audible signal, when a disturbance arises that requires blanking, in general a false value is stored, since before and after the disturbance only the amplitudes of the audible useful signal reach the low-frequency stage. Because of the superimposed amplitudes of the supplementary signals, residual disturbances of noticeable magnitude may persist in spite of the blanking and storage operation.

Some relief for this disadvantage is provided by the circuit described in German published patent application (OS) No. 2,052,058. In that case, an anti-resonant circuit (or trap) tuned to the stereo pilot signal is connected in series with the storage capacitor, so that this pilot signal is not stored in the capacitor. The method on which this circuit is based, namely, to insert in series with the storage capacitor one or more anti-resonant circuits in order to keep the pilot frequencies out of the storage device, has notable disadvantages. For each pilot signal a trap circuit must be inserted. The constitution of such circuits with antiresonant traps is very expensive and space consuming, because the coils required for the traps are not available in practicable form in either the thin-film or thick-film component technology. Furthermore, this method cannot in practice eliminate the sidebands situated on both sides of 38 kHz which, throughout their frequency range, may cause audible disturbances. The known circuit, therefore, does not make possible any optimum interference elimination and requires a great deal of expense for its provision.

It is an object of the present invention to provide a storage circuit for bridging blanking intervals that is simple to construct and provides an optimum interference elimination.

SUBJECT MATTER OF THE PRESENT INVENTION

Briefly, the demodulator of the receiver is made to feed through the blanking switch both a low-pass filter and a high-pass filter, and the outputs of these two filters are then summed to provide a combined output. The signal storage is provided in association with or as part of the low-pass filter. When the blanking switch is closed and the demodulated signal feeds through both filters and the summing circuit to the low-frequency stages of the receiver, the filter combination operates as an all-pass filter. When the blanking switch is open, the signal stored in or by the low-pass filter is furnished to the low-frequency stages and nothing is contributed by the high-pass filter. Typically, the capacitor of the low-pass filter serves also as the storage capacitor of the circuit and this capacitor may well be the only capacitor of the low-pass filter. The low-pass and high-pass filters may be constituted of resistors and capacitors each having an electrical magnitude which is the same as that of a resistor or capacitor, as the case may be, of the other filter. In general, the frequencies of the demodulated signal band which have periods of the same order of magnitude as at least some of the normally produced blanking intervals are in a frequency region in which the low-pass filter provides substantial attenuation, i.e. on the roll-off portion of the transmission curve.

The effect of the circuit arrangement of the present invention is to store only the desired audible signal portions. No trap circuits are necessary for the pilot signals and all tuning and trimming work required by such circuits is dispensed with.

In the case mentioned in which identical components are used in the low-pass and high-pass filters, the pass bands of these two filters adjoin so that an all-pass filter is formed, so that the signal normally provided at the input appears undistorted at the output.

A further advantage of the circuit according to the invention is that the transition region between high-pass and low-pass can be so designed, that for such frequencies in which the wave period is of the same order as the blanking interval, a smaller amplitude will be stored than that which is present at the beginning of the disturbance.

In the case of every blanking, the deviation of the stored signal from the dynamic blanked signal produces a residual disturbance. This residual disturbance may be substantial and may lead to audible disturbances if the dynamic signal changes greatly during the blanking interval. This effect appears in the case of signals of higher frequency, of which the periods lie in the same order of magnitude as the blanking intervals. For such frequencies, the residual disturbance is mitigated by storage of an attenuated amplitude. This advantage becomes noticeable as a tone quality improvement in the operation of the interference elimination circuit.

The invention is further described by way of illustrative example with reference to the drawing, in which the single FIGURE is a diagram, partly in block form, of a stereo broadcast receiver embodying a circuit according to the present invention.

There is shown diagrammatically in the drawing an antenna 1, a mixer stage 2, an intermediate frequency stage 3 and a demodulator 4. Behind the demodulator, there is an electrically controllable switch 5 that in the normal condition is closed, but which is opened when a disturbance is present. Beyond the switch 5 is connected the circuit embodying the present invention. Its output signal, which is provided by a summing amplifier 6, is supplied to a stereo decoder circuit 7 where it is split up and processed and then supplied to a low-frequency stage 8 by which the loudspeaker 9 is driven.

The circuit according to the present invention comprises two branches. The input signal of this circuit is supplied on the one hand over a resistor $R_1$ to a first input of the summing amplifier 6 and is supplied on the other hand through a capacitor $C_2$ to a second input of the summing amplifier 6. The connection point of the resistor $R_1$ and the first input of the summing amplifier 6 is connected through a capacitor $C_1$ to ground, and the connection point of the capacitor $C_2$ and the second input of the semi-amplifier is connected through a resistor $R_2$ to ground.

The connections just described result in the resistor $R_1$ and the capacitor $C_1$ forming a low-pass filter $R_1$, $C_1$, and the capacitor $C_2$ and the resistor $R_2$ forming a high-pass filter $C_2$, $R_2$. Preferably, the magnitudes of the two resistances $R_1$ and $R_2$ and of the two capacitors $C_1$ and $C_2$ are in each case equal. In that case, the passband of the low-pass filter and the passband of the high-pass filter are adjoining, so that after addition through the summing amplifier the effect of an all-pass filter is provided that allows the input signal to be transmitted undistorted — unchanged except for the general amplitude level (the amplifier overcomes the attenuation produced by the all-pass filter).

The capacitor $C_1$ belonging to the low-pass filter $R_1$, $C_1$ stores the signal transmitted through the low-pass filter, that is, when the demodulator 4 ceases to vary the charge of the capacitor $C_1$ through the resistor $R_1$ and the switch 5 because of the opening of the switch 5, the capacitor $C_1$ remains at the same charge that it had when the switch 5 opened, it being assumed that the summing amplifier 6 has a sufficiently high input impedance so that there is at most only a negligible leaking off of the charge of capacitor $C_1$ through the particular input of the amplifier 6 to which the capacitor $C_1$ is connected.

For the use of the circuit in accordance with this invention in connection with a blanking circuit or a stereo broadcast reception, particularly illustrated, the transition region between the frequency range that is passed by the low-pass filter $R_1$, $C_1$ and the frequency range that is passed by the high-pass filter $C_2$, $R_2$ lies distinctly below the lowest frequency pilot frequency (e.g. 19 kHz). Consequently, only the audible programmed signal will be stored and the higher frequencies, along with all pilot signals, do not reach the capacitor $C_1$. Thus, when the switch 5 is opened to blank out a disturbance, the capacitor $C_1$ stores only the amplitude of the audible program signal at the moment the switch was opened.

The basis of the above-described circuit is to provide this audible signal value existing before the beginning of the disturbance to the low-frequency stage during the period of blanking, in order to prevent any audible blanking gap or transient from being produced. After the switch 5 opens, the voltage in the high-pass branch of the circuit $C_2$, $R_2$ is zero, because there is no longer any change of voltage at the terminal of the switch 5 that is connected to the junction of resistor $R_1$ of the low-pass filter and the capacitor $C_2$ of the high-pass filter, while at the same time, as already described, the signal stored on the capacitor $C_1$, that originates only from an undisturbed signal from the audible frequency region, is applied to the summing amplifier 6 and, nothing being added to it from the high-pass filter, this stored signal proceeds to the final stages 7 and 8 of the receiver.

The transmission curves of the high-pass filter $C_2$, $R_2$ and of the low-pass filter $R_1$, $C_1$ do not have a sharp cut-off step or shoulder, but rather fall off gradually from the value in the transmission band down to zero, as is characteristic of RC filters (which are, of course, the type of filters readily produced with thin-film or thick-film integrated circuit technology). For the case of components of equal magnitudes in the two branches that was already mentioned above, the transmission region of the low-pass filter $R_1$, $C_1$ and that of the high-pass filter $C_2$, $R_2$ fit together to form an all-pass filter in such a way that there is a lower frequency region in which only the low-pass filter $R_1$, $C_1$ provides transmission, a transition region in which both the low-pass filter $R_1$, $C_1$ and the high-pass filter $C_2$, $R_2$ provide transmission and an upper frequency region, in which only the high-pass filter $C_2$, $R_2$ provides any substantial amount of transmission. The sum of the transmission curves of the low-pass filter $R_1$, $C_1$ and of the high-pass filter $C_2$, $R_2$ forms a straight line parallel to the frequency axis, indicating attenuation that is constant for all frequencies, hence frequency-independent transmission.

For radio apparatus that are designed only for monophonic operation, a different electrical dimensioning of the circuit of the present invention makes possible another advantage. That is, if the high-pass transmission curve and the low-pass transmission curve do not adjoin each other in the manner described above, but instead the skirts of the respective transmission bands where the attenuation falls off do not overlap or overlap very little, the sum curve is no longer a frequency-independent straight line, but rather a straight line interrupted by a dip, of which the falling transmission characteristic from the low frequencies towards the high ones (that is, on the low frequency side of the dip) depends principally on the drop-off of the low-pass transmission curve. This roll-off can be used as deemphasis that generally must be applied behind the demodulator in monophonic reception.

Although the invention has been described with reference to particular illustrative examples, it will be understood that variations may be made within the inventive concept.

For example, the circuit is applicable to cable-distributed transmissions as well as to locally demodulated signals and may also find application in closed-circuit multiplex transmissions in electrically disturbed locations.

I claim:

1. Circuit for storing the amplitude value of the lower-frequency portion of a composite electrical signal during intervals in which the provision of the signal from a source supplying the signal is temporarily interrupted by a switch, and a stored signal is therefore needed for signal continuity, said circuit comprising, in combination:
   a low-pass filter ($R_1$, $C_1$) and a high-pass filter ($C_2$, $R_2$) both arranged to be supplied with a signal from a signal source through interrupting switch means, said low-pass filter including a connection to a storage capacitor, and
   means for adding the outputs of said low-pass filter and of said high-pass filter.

2. A circuit as defined in claim 1, characterized in that said signal source is the demodulator of a radio broadcast receiver and in which said storage capacitor is a reactive component of said low-pass filter ($R_1$, $C_1$) serving also as a storage capacitor for the circuit while the circuit is cut off from said signal source by the interruptor switch means.

3. A circuit as defined in claim 2, in which said low-pass filter ($R_1$, $C_1$) and said high-pass filter ($C_2$, $R_2$) are composed of resistor and capacitor components each of which is of an electrical magnitude which is the same as that of a component of the other of said filters, whereby the combined transmission of said filters and said adding means for signals supplied through said interruptor switch means has substantially an all-pass characteristic.

4. A circuit as defined in claim 1, in which the attenuating portion of the filter characteristic of said low-pass filter outside of its effective passband is effective to provide relative attenuation in the range of frequencies for which the period is of the order of magnitude of the interruption intervals normally produced by said switching means.

5. A circuit as defined in claim 1, in which the respective passbands of said low-pass and high-pass filters are not effectively adjoining and leave a gap therebetween in which there is a dip in the combined transmission range of said filters and said adding means, for signals supplied through said interruption switch means.

* * * * *